(12) United States Patent
Hu

(10) Patent No.: US 9,799,622 B2
(45) Date of Patent: Oct. 24, 2017

(54) HIGH DENSITY FILM FOR IC PACKAGE

(71) Applicant: Dyi-Chung Hu, Hsinchu County (TW)

(72) Inventor: Dyi-Chung Hu, Hsinchu County (TW)

( * ) Notice: Subject to any disclaimer, the term of this patent is extended or adjusted under 35 U.S.C. 154(b) by 0 days.

(21) Appl. No.: 14/509,395

(22) Filed: Oct. 8, 2014

(65) Prior Publication Data

US 2015/0371965 A1 Dec. 24, 2015

Related U.S. Application Data

(63) Continuation-in-part of application No. 14/308,702, filed on Jun. 18, 2014.

(51) Int. Cl.
| | | |
|---|---|---|
| H01L 23/00 | (2006.01) | |
| H01L 23/498 | (2006.01) | |
| H01L 23/538 | (2006.01) | |
| H01L 21/78 | (2006.01) | |
| H01L 23/28 | (2006.01) | |
| H05K 1/11 | (2006.01) | |
| H01L 21/683 | (2006.01) | |
| H01L 23/31 | (2006.01) | |
| H01L 21/56 | (2006.01) | |
| H01L 25/065 | (2006.01) | |

(52) U.S. Cl.
CPC .......... *H01L 24/25* (2013.01); *H01L 21/6835* (2013.01); *H01L 21/78* (2013.01); *H01L 23/28* (2013.01); *H01L 23/49822* (2013.01); *H01L 23/49833* (2013.01); *H01L 23/5385* (2013.01); *H01L 24/14* (2013.01); *H01L 24/19* (2013.01); *H01L 24/20* (2013.01); *H01L 24/97* (2013.01); *H05K 1/111* (2013.01); *H01L 21/561* (2013.01); *H01L 23/3128* (2013.01); *H01L 25/0655* (2013.01); *H01L 2221/68345* (2013.01); *H01L 2224/16227* (2013.01); *H01L 2224/73253* (2013.01); *H01L 2224/97* (2013.01); *H01L 2924/15174* (2013.01); *H01L 2924/15311* (2013.01); *H01L 2924/15313* (2013.01); *H01L 2924/15788* (2013.01); *H01L 2924/18161* (2013.01)

(58) Field of Classification Search
CPC ....... H01L 2924/00; H01L 2924/00014; H01L 2924/32225; H01L 2924/73265; H01L 2924/48227
USPC ........................................................ 438/108
See application file for complete search history.

(56) References Cited

U.S. PATENT DOCUMENTS

| | | | |
|---|---|---|---|
| 5,162,240 A | 11/1992 | Saitou et al. | |
| 6,284,984 B1 * | 9/2001 | Ohyama ................ | H05K 1/112 174/260 |

(Continued)

*Primary Examiner* — Fernando L Toledo
*Assistant Examiner* — Lawrence-Linh T Nguyen
(74) *Attorney, Agent, or Firm* — Jianq Chyun IP Office

(57) ABSTRACT

The present invention discloses a high density film for IC package. The process comprises: a redistribution layer is fabricated following IC design rule, with a plurality of bottom pad formed on bottom, and with a plurality of first top pad formed on top; wherein the density of the plurality of bottom pad is higher than the density of the plurality of first top pad; and a top redistribution layer is fabricated following PCB design rule, using the plurality of the first top pad as a starting point; with a plurality of second top pad formed on top; wherein a density of the plurality of first top pad is higher than a density of the plurality of second top pad.

14 Claims, 12 Drawing Sheets

(56) References Cited

U.S. PATENT DOCUMENTS

| | | | |
|---|---|---|---|
| 2003/0136577 A1* | 7/2003 | Abe | H01L 23/142 |
| | | | 174/255 |
| 2007/0256858 A1 | 11/2007 | Kariya et al. | |
| 2009/0242245 A1 | 10/2009 | Asano | |
| 2009/0294166 A1* | 12/2009 | Yoshimura | H05K 3/445 |
| | | | 174/264 |
| 2011/0024167 A1* | 2/2011 | Hashimoto | H05K 3/4688 |
| | | | 174/258 |
| 2012/0119767 A1* | 5/2012 | Su | G01R 31/2817 |
| | | | 324/750.03 |
| 2012/0153445 A1 | 6/2012 | Son et al. | |
| 2013/0062777 A1* | 3/2013 | Ogata | H01L 24/05 |
| | | | 257/774 |
| 2013/0249075 A1* | 9/2013 | Tateiwa | H05K 3/4682 |
| | | | 257/734 |
| 2014/0102777 A1 | 4/2014 | Chen et al. | |

* cited by examiner

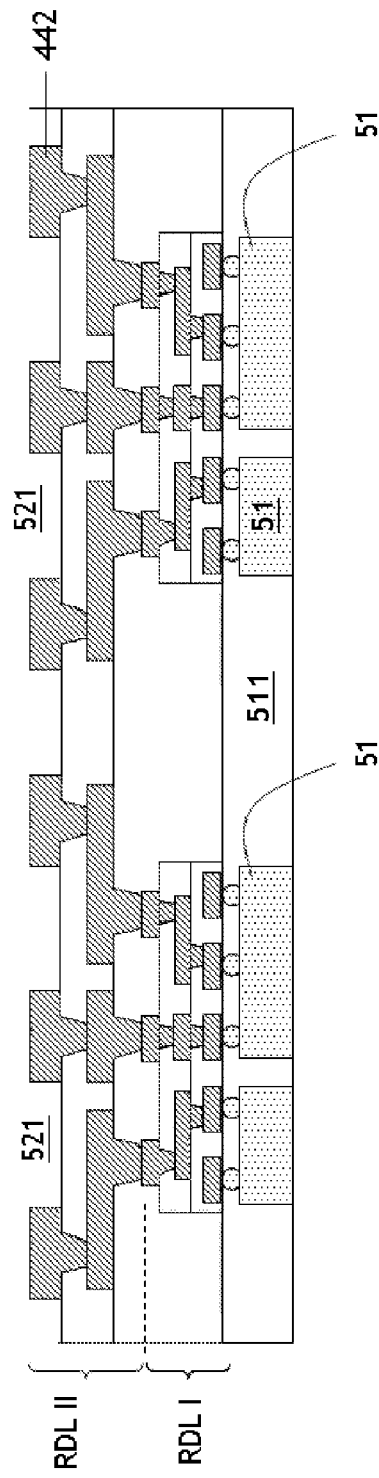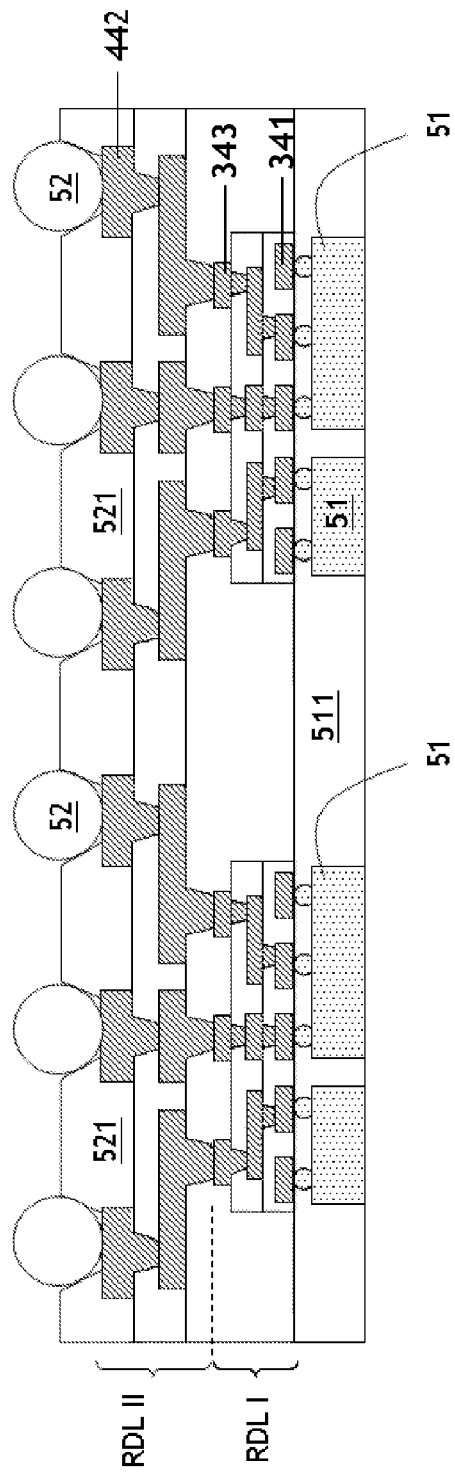

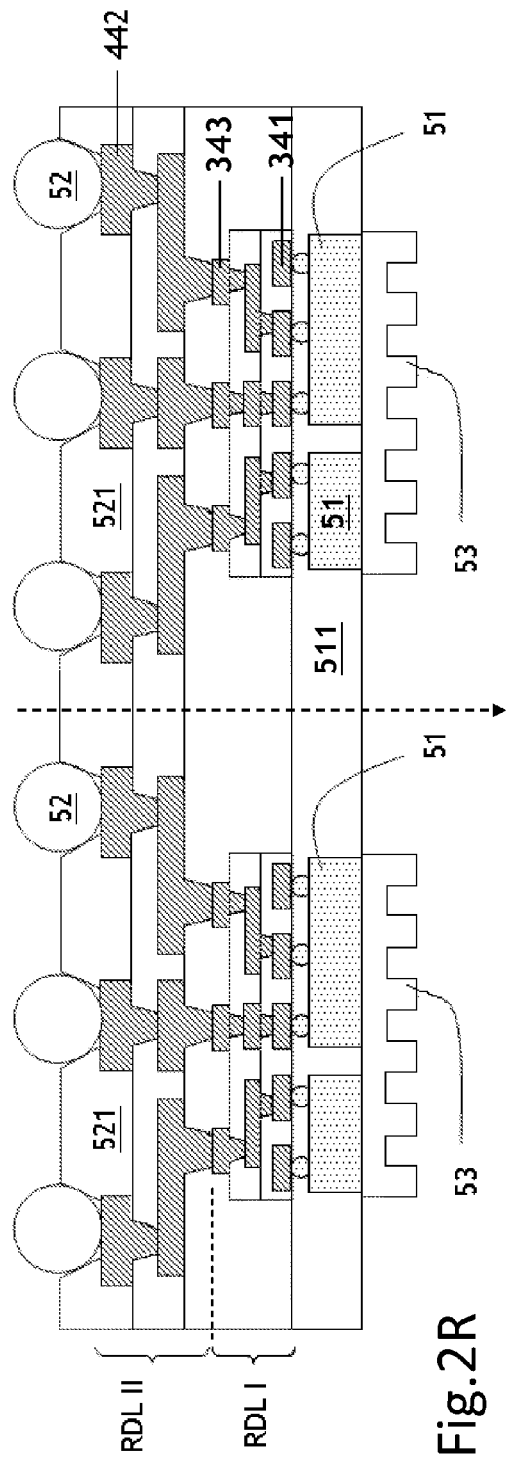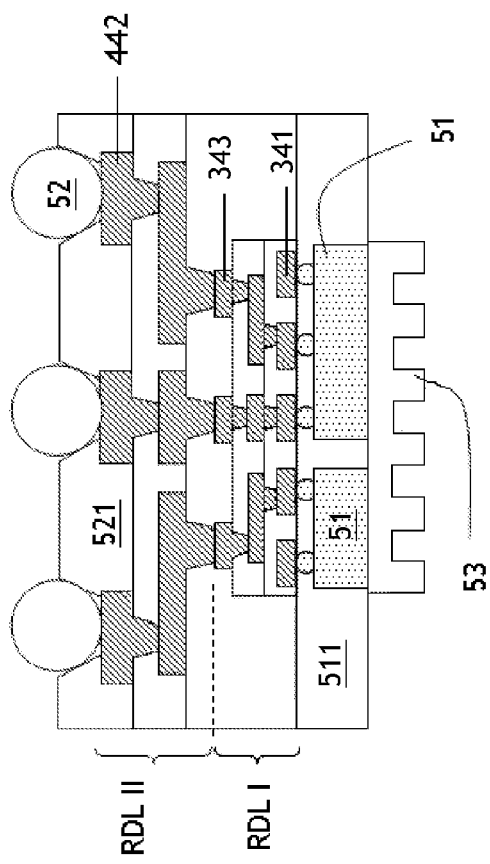
Fig.2R
FIG.2S

Fig.3

A process flow for fabricating a high density film, comprises:

fabricating a bottom redistribution layer RDL I following IC design rule, with a plurality of bottom pad 341 formed on bottom, and with a plurality of first top pad 343 formed on top; wherein the density of the plurality of bottom pad 341 is higher than the density of the plurality of first top pad 343; and fabricating a top redistribution layer RDL II following a PCB design rule, using the plurality of the first top pad 343 as a starting point; with a plurality of second top pad 442 formed on top; wherein a density of the plurality of first top pad 343 is higher than a density of the plurality of second top pad 442.

Fig.4

A process flow for fabricating a high density film, comprises:

preparing a temporary carrier I;
applying a first release layer 31 on top of the temporary carrier I;
forming a seed layer 32 on top of the first release layer 31;
forming a plurality of bottom pad 341 on top of the seed layer 32;
etching the seed layer 32 between the bottom pads 341;
forming a bottom redistribution layer RDL I following IC design rule, using the plurality of bottom pad 341 as a starting point; with a plurality of first top pad 343 formed on top, to form a circuitry film RDL I;
removing the temporary carrier I to release the circuitry film RDL I;
singulating the circuitry film RDL I to produce a plurality of RDL I unit preparing a temporary carrier II;
applying a second release layer 311 on top of the temporary carrier II;
arranging a plurality of the RDL I unit on top of the second release layer 311;
forming a second top redistribution layer RDL II following PCB design rule on top of the plurality of RDL I unit, using the first top pad 343 as a starting point; with a plurality of second top pad 442 formed on top; and
removing the temporary carrier II to release a high density film (RDL I + RDL II).

Fig.5

A process flow for fabricating an IC package using the high density film according to the present invention, comprises:

preparing a high density film (RDL I + RDL II) prepared according to Fig.3 or Fig.4.

mounting at least one chip 51 on bottom of the bottom pad 341;

molding the chip 51 with a molding compound 511;

thinning the molding compound 511 to reveal bottom surface of the chip 51;

mounting a heat sink 53 on bottom of the chip 51; and singulating to produce a plurality of separated unit.

HIGH DENSITY FILM FOR IC PACKAGE

RELATED APPLICATIONS

The present application is a continuation-in-part of U.S. application Ser. No. 14/308,702, filed Jun. 18, 2014.

BACKGROUND

Technical Field

The present invention relates to a high density film for IC package, especially relates to a high density film without having any interposer. A traditional interposer includes such as a semiconductor interposer with through silicon via (TSV) or a glass interposer with through glass via (TGV) embedded therein.

Description of Related Art

FIG. 1 shows a prior art substrate for IC package

FIG. 1 shows a prior art substrate for IC package disclosed in US2014/0102777A1 which has an embedded silicon interposer 20. The silicon interposer 20 has four later sides 206. A molding compound 22 wraps the silicon interposer 20 around the four lateral sides 206. A plurality of via metal 200 is made through the silicon interposer 20. An insulation liner 201 is made between the through via 200 and the silicon interposer 20 for an electrical insulation therebetween. A top redistribution layer 21 is made on top of the silicon interposer 20 with a plurality of metal pad 210 exposed on top. The plurality of metal pad 210 on top is provided for accommodating an IC chip (not shown) to mount. A circuit built-up layer 25 is made on bottom of the silicon interposer 20 with a plurality of metal pad 220 configured on bottom. A plurality of solder ball 4 is configured and each solder ball 4 is configured on bottom of a corresponding bottom metal pad 220.

BRIEF DESCRIPTION OF THE DRAWINGS

FIGS. 2N~2S show an IC package using the high density film according to the present invention.

FIG. 3 shows a process flow for fabricating a high density film according to the present invention.

FIG. 4 shows a further process flow for fabricating a high density film according to the present invention.

FIG. 5 shows a process flow for fabricating an IC package using the high density film according to the present invention.

DETAILED DESCRIPTION OF THE INVENTION

FIGS. 2A~2M show a process for fabricating a high density film according to the present invention.

Figure 1:
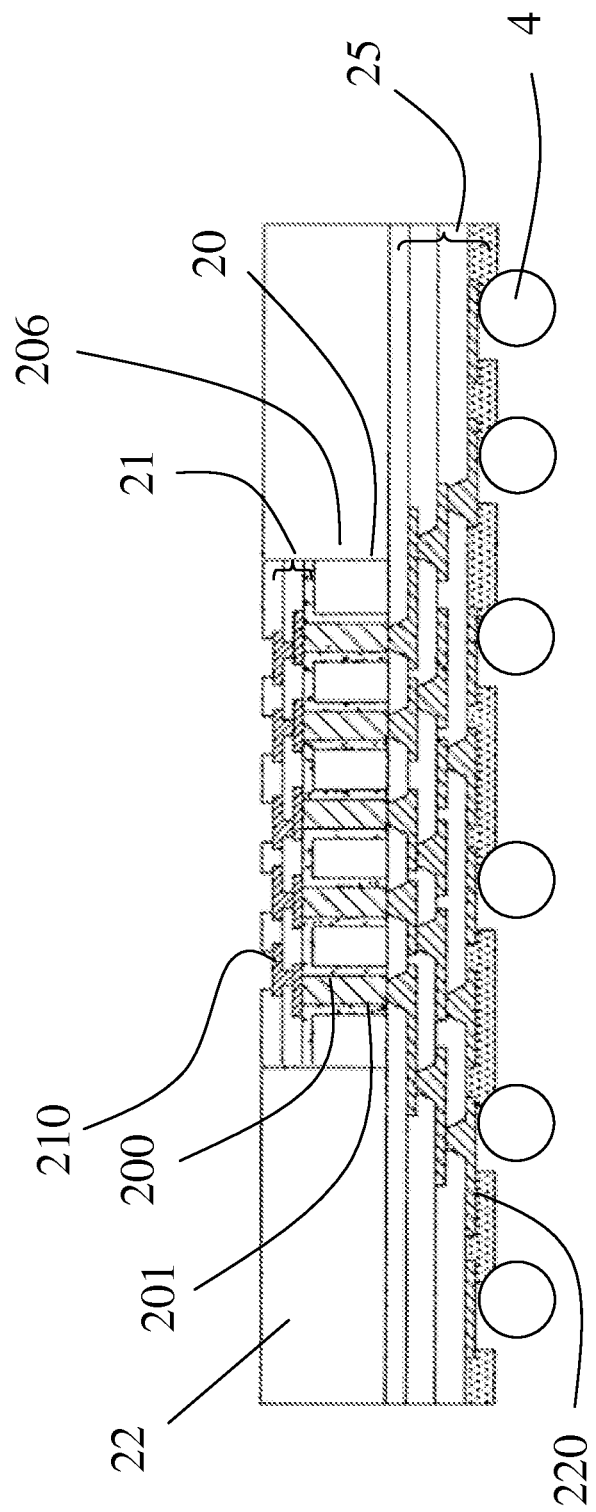
FIG. 1 shows a prior art IC package.
Figure 2A:
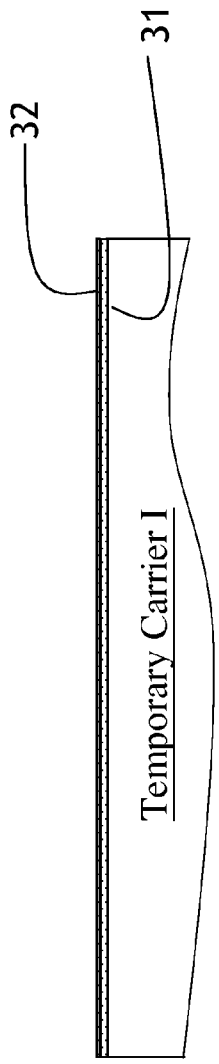
FIGS. 2A~2M show a process for fabricating a high density film according to the present invention.

FIG. 2A shows a temporary carrier I is prepared, a first release layer 31 is applied on top of the temporary carrier I, and a seed layer 32, such Ti/Cu, is formed on top of the first release layer 31.

Figure 2B:
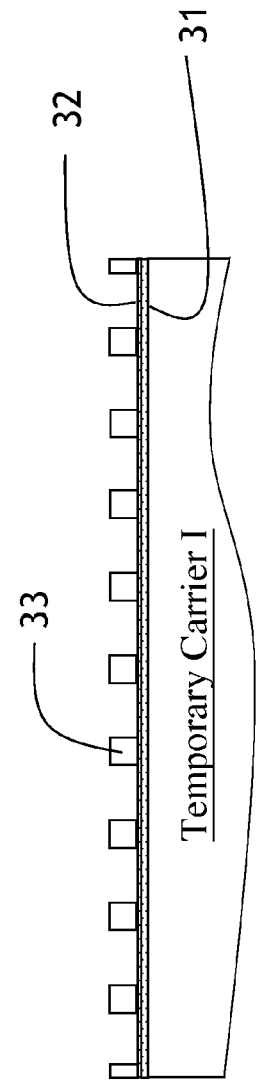

FIG. 2B shows a patterned photoresist 33 is formed on top of the seed layer 32.

Figure 2C:
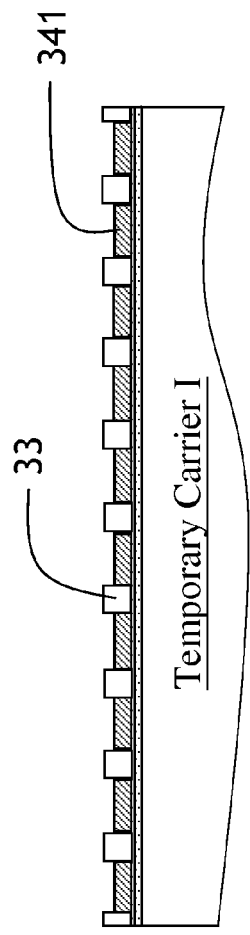

FIG. 2C shows a plurality of bottom pad 341 is formed on top of the seed layer 32.

Figure 2D:
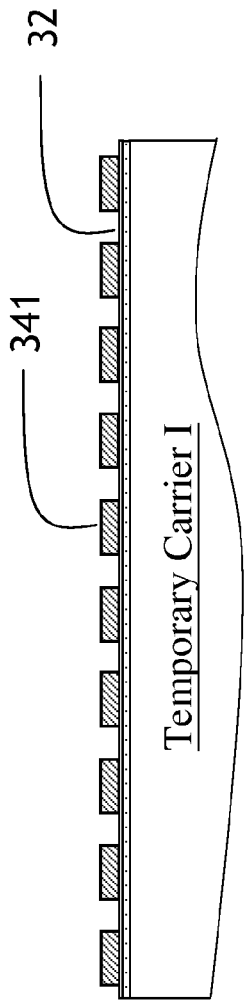

FIG. 2D shows the patterned photoresist 33 is removed and a plurality of bottom pad 341 is left.

Figure 2E:
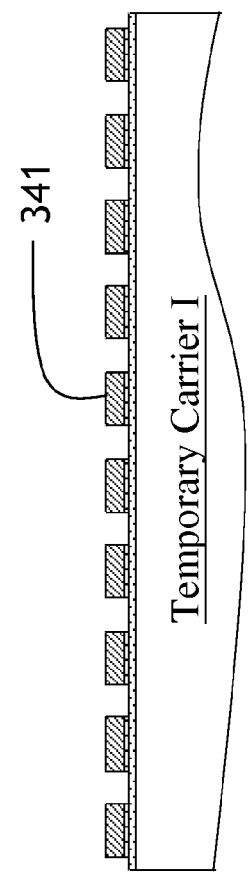

FIG. 2E shows the seed layer 32 between pads 341 are removed.

Figure 2F:
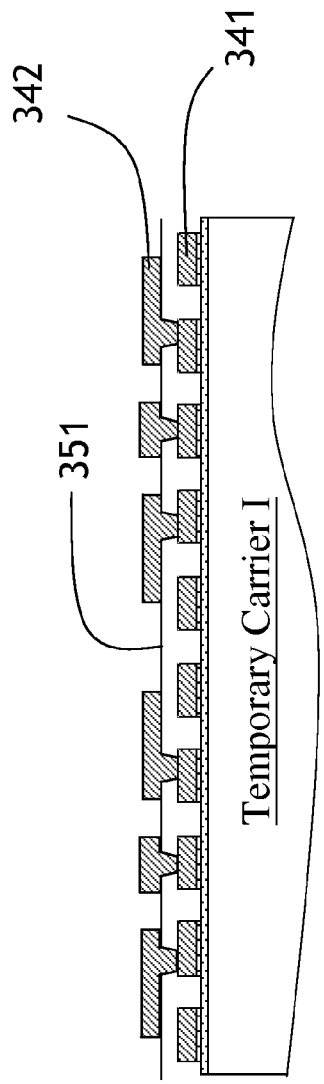

FIG. 2F shows a first redistribution circuitry 342 is formed following IC design rule, using the plurality of bottom pad 341 as a starting point, comprising the steps: a first dielectric layer 351 is applied on top of the bottom pad 341, and then a first redistribution circuitry 342 is formed through traditional technique.

Figure 2G:
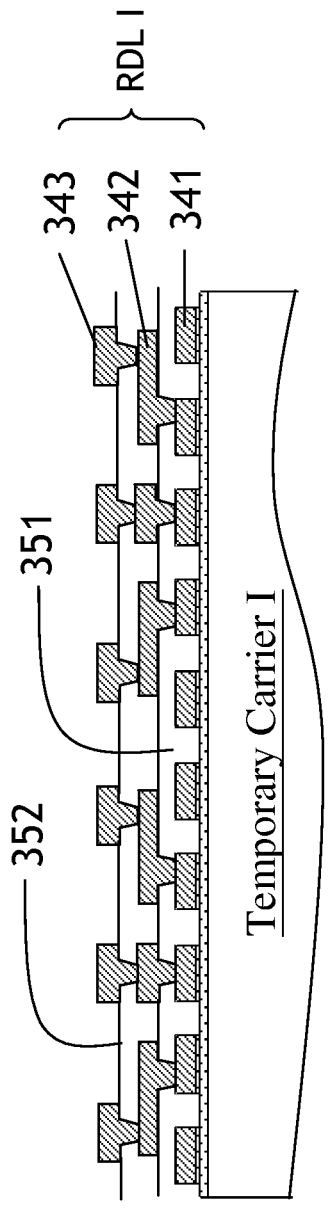

FIG. 2G shows a plurality of first top pad 343 is formed comprising the following steps: a second dielectric layer 352 is applied on top of the first redistribution circuitry 342, a plurality of first top pad 343 is formed through traditional technique. A first redistribution circuitry 342 and a plurality of first top pad 343 are exemplified in this embodiment. The redistribution circuitry layer can be repeatedly processed to even more layers to fan out the circuitry if desired. The bottom pad 341, the first redistribution circuitry 342 and the first top pad 343 are collectively called circuitry film RDL I.

Figure 2H:
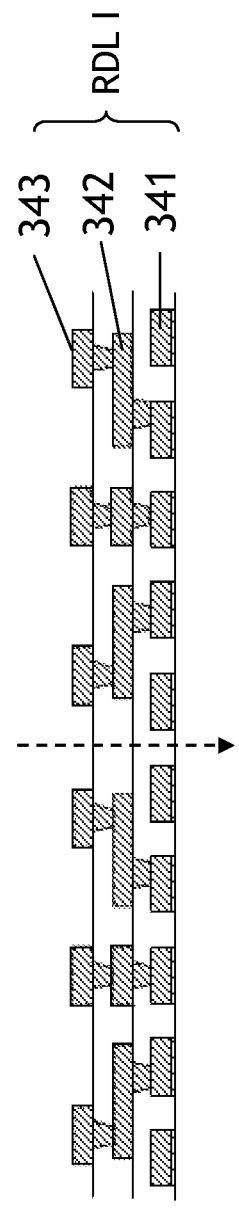

FIG. 2H shows the temporary carrier I is removed to form a circuitry film RDL I. And then a singulating process is performed to produce a plurality of single unit of circuitry film RDL I.

Figure 2I:
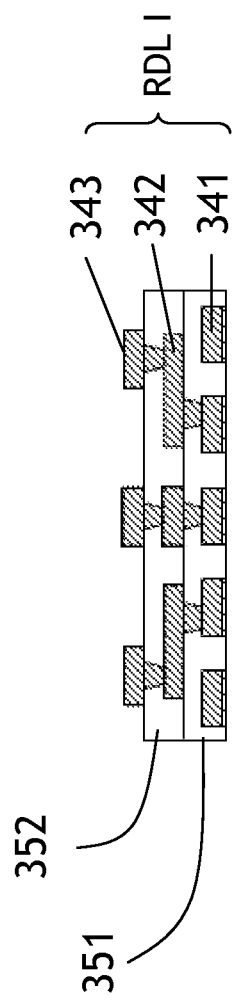

FIG. 2I shows a single unit of circuitry film RDL I.

Figure 2J:
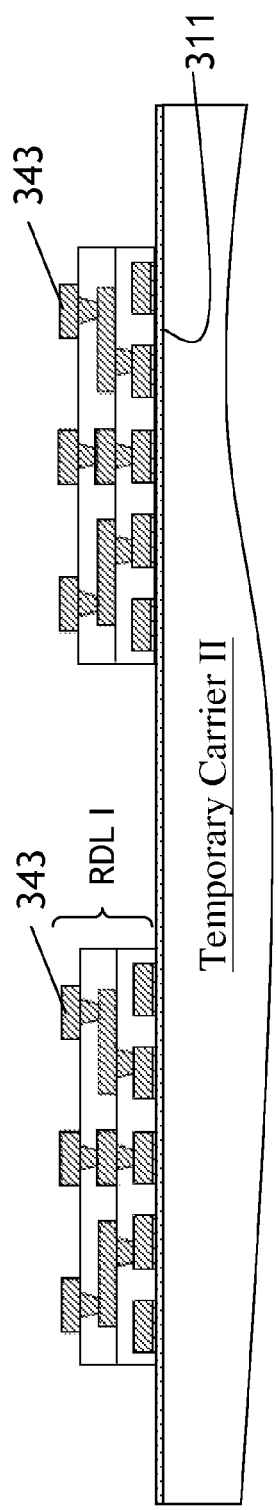

FIG. 2J shows a temporary carrier II is prepared. A second release layer 311 is applied on top of the temporary carrier II. A plurality of circuitry film RDL I is arranged on top of the second release layer 311.

Figure 2K:
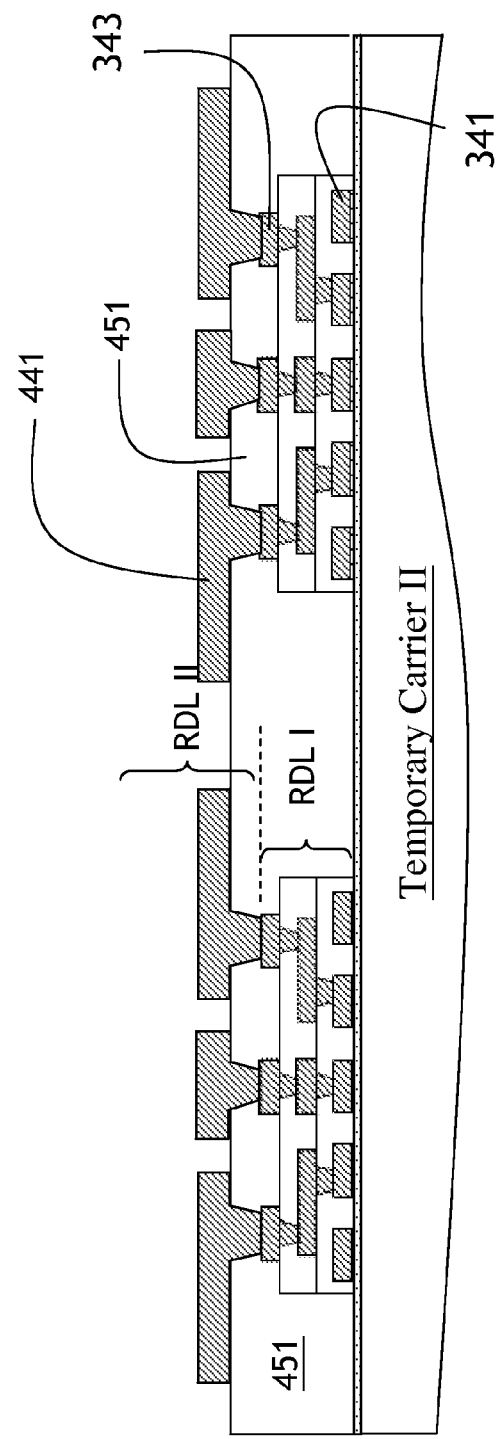

FIG. 2K shows a second redistribution circuitry 441 is formed following PCB design rule, using the plurality of first top pad 343 as a starting point, comprising the steps: a third dielectric layer 451 is applied on top of the circuitry film RDL I, and then a second redistribution circuitry 441 is formed through traditional technique.

The dielectric layer used for PCB process can be one of Ajinomoto build-up films (ABF) or Pre-preg (PP).

Figure 2L:
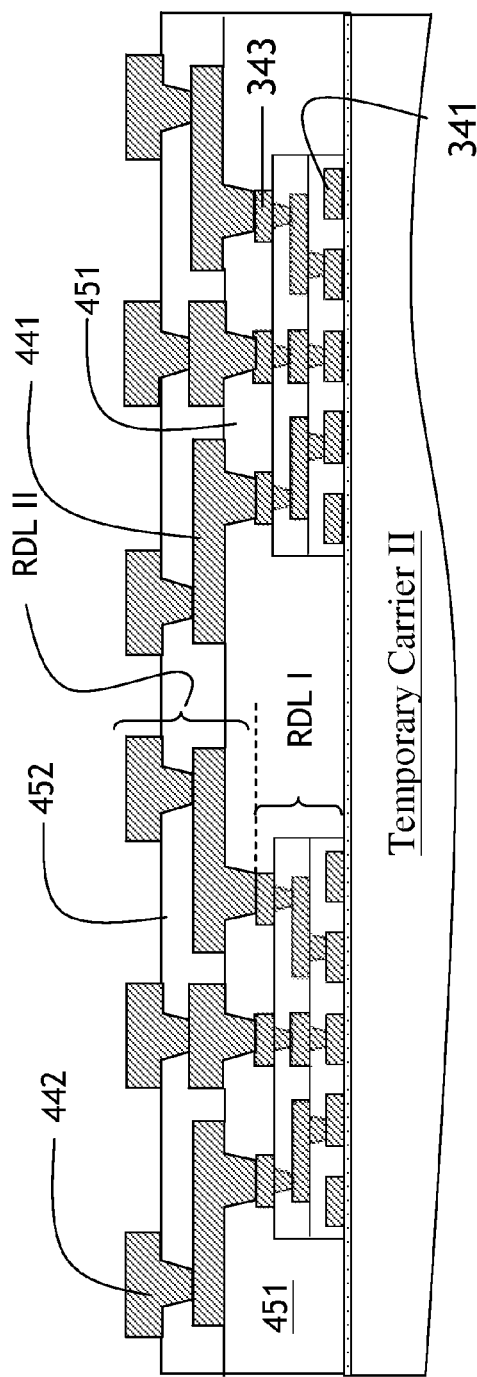

FIG. 2L shows a plurality of second top pad 442 is formed, comprising the steps: a fourth dielectric layer 452 is applied on top of the second redistribution circuitry 441 and the third dielectric layer 451, a plurality of second top pad 442 is formed through traditional technique. A second redistribution circuitry 441 and a plurality of second top pad 442 are exemplified in this embodiment. The redistribution circuitry can be repeatedly processed to even more layers to fan out the circuitry if desired. The redistribution circuitry 441 and the second top pad 442 are collectively called circuitry film RDL II. A high density film (RDL I+RDL II) is formed on top of the second release layer 311.

Figure 2M:
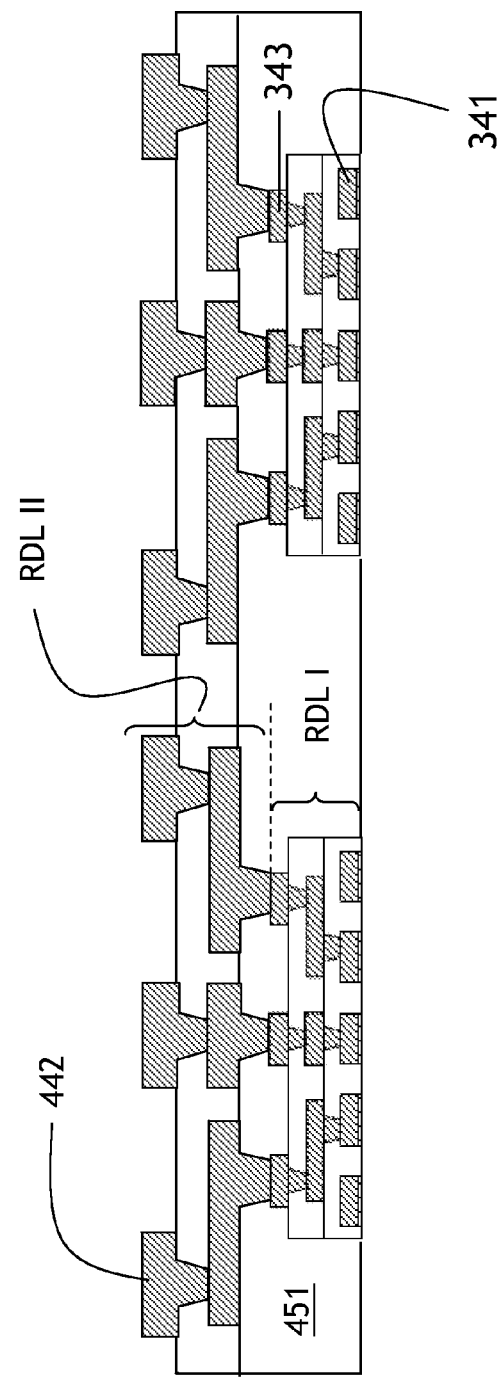

FIG. 2M shows the temporary carrier II is removed, and a high density film (RDL I+RDL II) is released.

FIGS. 2N~2S show a fabricating process for an IC package using the high density film according to the present invention.

Figure 2N:
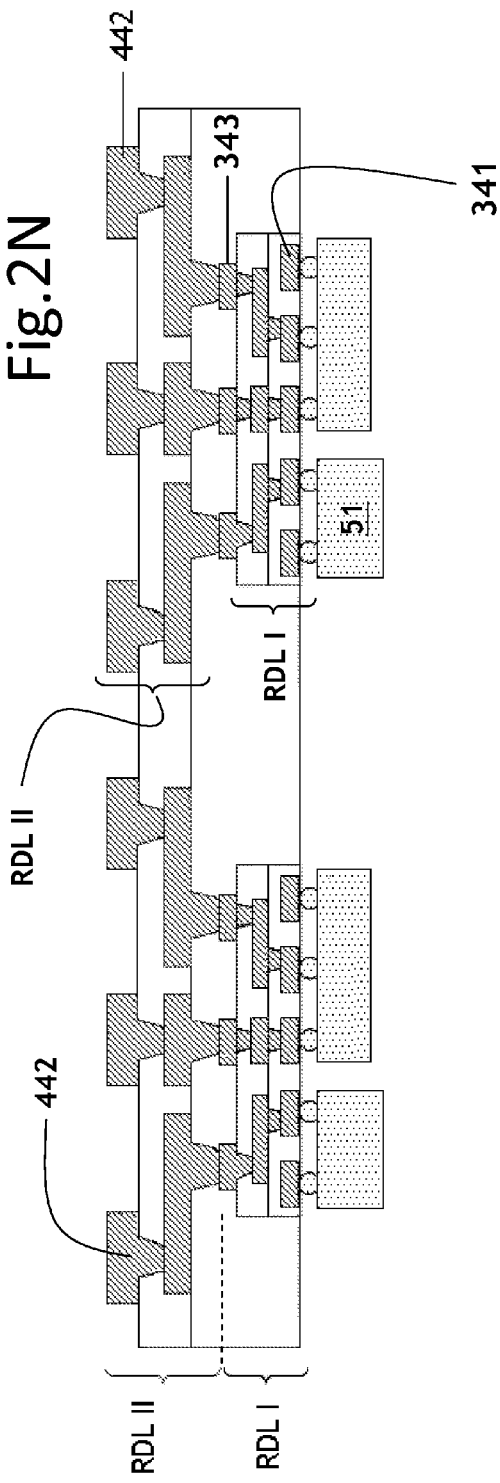

FIG. 2N shows at least one chip 51 is mounted on a bottom of the bottom pad 341.

Figure 2O:
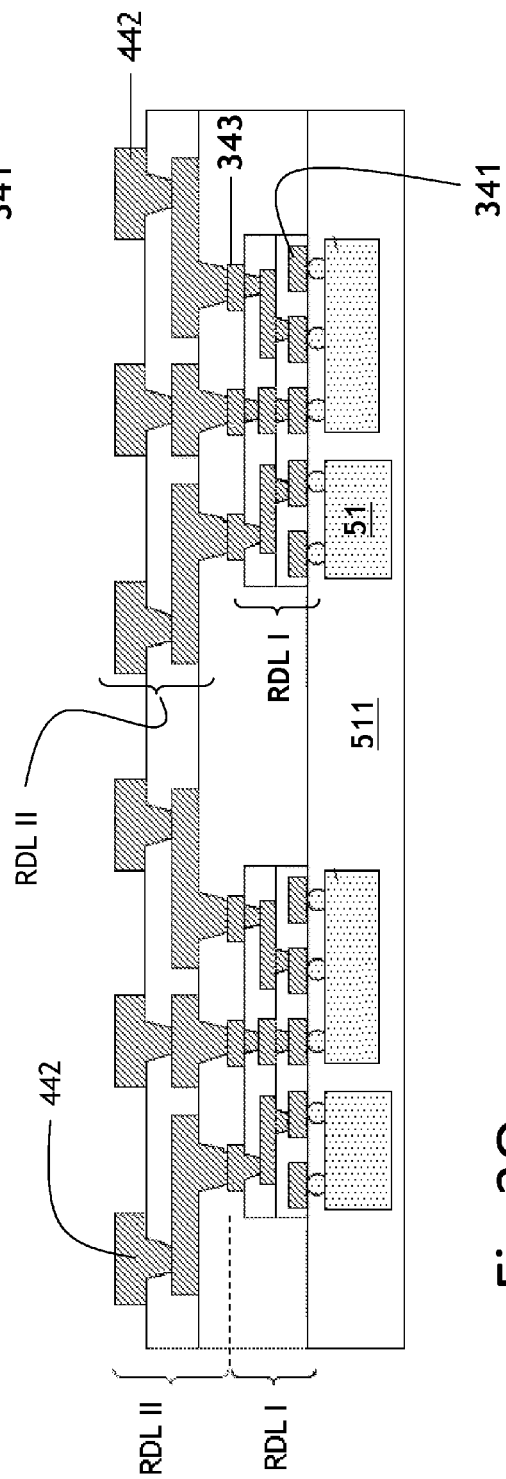

FIG. 2O shows a molding compound 511 is applied to encapsulate the chip or chips 51.

FIG. 2P shows a thinning process is applied onto the molding compound 511 to reveal a bottom surface of the chip 51 for heat dissipation of the chip.

FIG. 2Q shows a dielectric layer 521 is applied between the second top pads 442, and a plurality of solder ball 52 is planted, each solder ball 52 is configured on top of a corresponding top pad 442.

FIG. 2R shows a heat sink 53 is configured on a bottom surface of the chip 51 for further heat dissipation.

FIG. 2S shows a single unit of the IC package is formed after a singulating process applied on the product of FIG. 2R.

FIG. 3 shows a process flow for fabricating a high density film according to the present invention, comprises:

fabricating a bottom redistribution layer RDL I following IC design rule, with a plurality of bottom pad 341 formed on bottom, and with a plurality of first top pad 343 formed on top; wherein the density of the plurality of bottom pad 341 is higher than the density of the plurality of first top pad 343; and fabricating a top redistribution layer RDL II following PCB design rule, using the plurality of the first top pad 343 as a starting point; with a plurality of second top pad 442 formed on top; wherein a density of the plurality of first top pad 343 is higher than a density of the plurality of second top pad 442.

FIG. 4 shows a further process flow for fabricating a high density film, comprises:

preparing a temporary carrier I;

applying a first release layer 31 on top of the temporary carrier I;

forming a seed layer 32 on top of the first release layer 31;

forming a plurality of bottom pad 341 on top of the seed layer;

etching the seed layer between the bottom pads 341;

forming a bottom redistribution layer RDL I following IC design rule, using the bottom pad 341 as a starting point; with a plurality of first top pad 343 formed on top, to form circuitry film RDL I;

removing the temporary carrier I to release the circuitry film RDL I;

singulating the circuitry film RDL I to produce a plurality of RDL I unit preparing a temporary carrier II;

applying a second release layer 311 on top of the temporary carrier II;

arranging a plurality of the RDL I unit on top of the second release layer 311;

forming a second top redistribution layer RDL II following PCB design rule on top of the plurality of RDL I unit, using the first top pad 343 as a starting point; with a plurality of second top pad 442 formed on top; and removing the temporary carrier II to release a high density film (RDL I+RDL II).

FIG. 5 shows a process flow for fabricating an IC package using the high density film according to the present invention, comprises:

removing the temporary carrier I to release the bottom redistribution layer RDL I;

singulating the bottom redistribution layer RDL I to produce a plurality of RDL I unit;

preparing a temporary carrier II;

applying a second release layer 311 on top of the temporary carrier II;

arranging a plurality of the RDL I unit on a top of the second release layer 311;

forming a second top redistribution layer RDL II following PCB design rule on top of the plurality of RDL I unit, using the plurality of first top pad 343 as a starting point; with a plurality of second top pad 442 formed on top;

removing the temporary carrier II to release a high density film (RDL I+RDL II);

mounting at least one chip 51 on bottom of the plurality of bottom pad 341;

molding the chip 51 with a molding compound 511;

thinning the molding compound 511 from bottom to reveal the bottom surface of the chip 51;

mounting a heat sink 53 on bottom of the chip 51; and singulating to produce a plurality of separated unit.

While several embodiments have been described by way of example, it will be apparent to those skilled in the art that various modifications may be configured without departs from the spirit of the present invention. Such modifications are all within the scope of the present invention, as defined by the appended claims.

What is claimed is:

1. An integrated circuit (IC) package, comprising:
a bottom redistribution layer fabricated according to IC design rule, the bottom redistribution layer having
a plurality of first bottom pads formed on a bottom of the bottom redistribution layer,
a plurality of first top pads formed on a top of the bottom redistribution layer,
at least one first dielectric layer between the plurality of first bottom pads and the plurality of first top pads, and
a plurality of first vias embedded in the at least one first dielectric layer, and electrically connecting the plurality of first bottom pads and the plurality of first top pads,
wherein a density of the plurality of first bottom pads is higher than a density of the plurality of first top pads; and
a top redistribution layer fabricated according to PCB design rule, the top redistribution layer having
a plurality of second bottom pads formed on the plurality of the first top pads,
a plurality of second top pads formed on a top of the top redistribution layer,
at least one second dielectric layer between the plurality of second bottom pads and the plurality of second top pads, and
a plurality of second vias embedded in the at least one second dielectric layer, and electrically connecting the plurality of second bottom pads and the plurality of second top pads,
wherein the density of the plurality of first top pads is higher than a density of the plurality of second top pads,
wherein
sides and the top of the bottom redistribution layer have interfaces with a lowermost dielectric layer of the at least one second dielectric layer of the top redistribution layer, a bottom surface of the lowermost dielectric layer opposite to the plurality of first top pads, is coplanar with a bottom surface of the at least one first dielectric layer opposite to the plurality of first top pads and surfaces of the plurality of first bottom pads exposed by the at least one first dielectric layer,
the sides and the top of the bottom redistribution layer are in direct contact with the lowermost dielectric layer of the top redistribution layer at said interfaces,
the plurality of second vias of the top redistribution layer includes a plurality of lowermost vias extending downwardly from the plurality of second bottom pads,
the lowermost dielectric layer of the top redistribution layer is under the plurality of second bottom pads,
the lowermost dielectric layer of the top redistribution layer is under the plurality of second bottom pads,
the lowermost dielectric layer of the top redistribution layer extends continuously downward from the plurality of second bottom pads to the bottom redistribution layer, and embeds therein the plurality of lowermost vias and the plurality of the first top pads.

2. An IC package as claimed in claim 1, further comprising:
   at least one chip electrically coupled to the plurality of first bottom pads.

3. An IC package as claimed in claim 2, further comprising:
   a molding compound encapsulating the chip.

4. An IC package as claimed in claim 3, wherein
   the molding compound has a bottom surface coplanar with a bottom surface of the chip.

5. An IC package as claimed in claim 4, further comprising:
   a plurality of solder balls, each configured on top of a corresponding second top pad among the plurality of second top pads.

6. An IC package as claimed in claim 4, further comprising:
   a heat sink mounted on the bottom surface of the chip.

7. An IC package as claimed in claim 4, further comprising:
   a further chip electrically coupled to the plurality of first bottom pads,
   wherein
   the molding compound encapsulates the further chip, and
   the bottom surface of the molding compound is coplanar with a bottom surface of the further chip.

8. An IC package as claimed in claim 7, further comprising:
   a common heat sink mounted on the bottom surfaces of the chips.

9. An IC package as claimed in claim 1, wherein
   the lowermost dielectric layer of the top redistribution layer surrounds the bottom redistribution layer, and has a thickness greater than that of the bottom redistribution layer.

10. An IC package as claimed in claim 1, wherein
    the entire bottom redistribution layer, except for a lowermost surface thereof, is embedded in the lowermost dielectric layer of the top redistribution layer.

11. An integrated circuit (IC) package, comprising:
    a bottom redistribution layer fabricated according to IC design rule, the bottom redistribution layer having
      a plurality of first bottom pads formed on a bottom of the bottom redistribution layer,
      a plurality of first top pads formed on a top of the bottom redistribution layer,
      at least one dielectric layer between the plurality of first bottom pads and the plurality of first top pads, and
      a plurality of vias extending through the at least one dielectric layer, and electrically connecting the plurality of first bottom pads and the plurality of first top pads,
      wherein a density of the plurality of bottom pads is higher than a density of the plurality of first top pads; and
    a top redistribution layer fabricated according to PCB design rule, the top redistribution layer formed on the plurality of the first top pads and having a plurality of second top pads formed on a top of the top redistribution layer, wherein the density of the plurality of first top pads is higher than a density of the plurality of second top pads,
    wherein
    a lowermost dielectric layer of the top redistribution layer is co-elevational with an entirety of the bottom redistribution layer,
    the top redistribution layer further comprises:
      a plurality of second bottom pads, and
      a plurality of lowermost vias extending downwardly from the plurality of second bottom pads,
      the lowermost dielectric layer of the top redistribution layer is under the plurality of second bottom pads, and
      the lowermost dielectric layer of the top redistribution layer extends continuously downward from the plurality of second bottom pads to the bottom redistribution layer, a bottom surface of the lowermost dielectric layer opposite to the plurality of first top pads is coplanar with a bottom surface of the at least one dielectric layer opposite to the plurality of first top pads and surfaces of the plurality of first bottom pads exposed by the at least one dielectric layer.

12. An IC package as claimed in claim 11, wherein
    sides and the top of the bottom redistribution layer have interfaces with the lowermost dielectric layer of the top redistribution layer, and
    the sides and the top of the bottom redistribution layer are in direct contact with the lowermost dielectric layer of the top redistribution layer at said interfaces.

13. An IC package as claimed in claim 12, wherein
    the lowermost dielectric layer of the top redistribution layer embeds therein the plurality of lowermost vias and the plurality of the first top pads.

14. An integrated circuit (IC) package, comprising:
    a bottom redistribution layer fabricated according to IC design rule, the bottom redistribution layer comprising:
      a plurality of bottom pads formed on a bottom of the bottom redistribution layer,
      a plurality of first top pads formed on a top of the bottom redistribution layer, wherein a density of the plurality of bottom pads is higher than a density of the plurality of first top pads, and
      at least one first dielectric layer between the plurality of first bottom pads and the plurality of first top pads, wherein the at least one first dielectric layer comprises a bottom surface where the plurality of first bottom pads are located; and
    a top redistribution layer fabricated according to PCB design rule, wherein the bottom redistribution layer is embedded in the top redistribution layer, the top redistribution layer comprises:
      a plurality of second top pads formed on a top of the top redistribution layer, wherein the density of the plurality of first top pads is higher than a density of the plurality of second top pads, and
      at least one second dielectric layer between the plurality of first bottom pads and the plurality of second top pads, wherein the at least one second dielectric layer comprises a bottom surface opposite to the plurality of the second top pads, and the bottom surface of the at least one second dielectric layer is coplanar with the bottom surface of the at least one first dielectric layer and surfaces of the plurality of first bottom pads exposed by the at least one first dielectric layer.

* * * * *